US012677670B2

(12) United States Patent　　　　(10) Patent No.: US 12,677,670 B2
Otsubo et al.　　　　　　　　　　　(45) Date of Patent: Jul. 7, 2026

(54) CIRCUIT MODULE

(71) Applicant: Murata Manufacturing Co., Ltd., Kyoto (JP)

(72) Inventors: Yoshihito Otsubo, Nagaokakyo (JP); Morio Takeuchi, Nagaokakyo (JP); Tsuyoshi Takakura, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 651 days.

(21) Appl. No.: 18/189,500

(22) Filed: Mar. 24, 2023

(65) Prior Publication Data

US 2023/0230951 A1　　Jul. 20, 2023

Related U.S. Application Data

(63) Continuation of application No. PCT/JP2021/035422, filed on Sep. 27, 2021.

(30) Foreign Application Priority Data

Oct. 2, 2020　(JP) ................................. 2020-167857

(51) Int. Cl.
　　*H10W 44/20* (2026.01)
　　*H10W 42/20* (2026.01)
　　*H10W 70/60* (2026.01)
　　*H10W 70/65* (2026.01)
　　*H10W 72/00* (2026.01)
　　*H10W 90/00* (2026.01)
(52) U.S. Cl.
　　CPC ........... *H10W 44/20* (2026.01); *H10W 42/20* (2026.01); *H10W 70/611* (2026.01); *H10W*

*70/65* (2026.01); *H10W 72/071* (2026.01); *H10W 72/07554* (2026.01); *H10W 90/754* (2026.01)

(58) Field of Classification Search
CPC ..................................................... H01L 23/552
See application file for complete search history.

(56) References Cited

U.S. PATENT DOCUMENTS

| 10,943,871 B2 * | 3/2021 | Jeon .................... H01L 21/4889 |
| 11,342,276 B2 * | 5/2022 | Chung .................... H01L 25/50 |
| 2018/0324940 A1 | 11/2018 | Choi et al. |

(Continued)

FOREIGN PATENT DOCUMENTS

| JP | 3267671 B | 3/2002 |
| JP | 2003-318357 A | 11/2003 |

(Continued)

OTHER PUBLICATIONS

International Search Report for PCT/JP2021/035422 dated Nov. 16, 2021.

*Primary Examiner* — Yu-Hsi D Sun

(74) *Attorney, Agent, or Firm* — McDonald Hopkins LLC

(57)　　　　　ABSTRACT

To provide a circuit module capable of suppressing a decrease in an area for mounting an electronic component on a substrate even when a wire for shielding the electronic component is connected to the substrate. A circuit module according to the present disclosure includes a substrate, a first component mounted on the substrate and including a ground terminal on an upper surface, first wires that connect the ground terminal to the substrate, and a second component mounted on the substrate, in which overlapping first wires in plan view.

20 Claims, 8 Drawing Sheets

(56) References Cited

U.S. PATENT DOCUMENTS

| | | | |
|---|---|---|---|
| 2020/0043864 A1 | 2/2020 | Otsubo et al. | |
| 2020/0043865 A1 | 2/2020 | Otsubo et al. | |
| 2020/0211998 A1 | 7/2020 | Uejima et al. | |
| 2020/0365476 A1* | 11/2020 | Otsubo | H01L 23/49811 |
| 2022/0392849 A1* | 12/2022 | Chen | H01L 21/56 |

FOREIGN PATENT DOCUMENTS

| | | | |
|---|---|---|---|
| JP | 2004-342849 A | 12/2004 |
| JP | 2010-003799 A | 1/2010 |
| JP | 2020-025075 A | 2/2020 |
| JP | 2020-025076 A | 2/2020 |
| JP | 2020-108069 A | 7/2020 |
| WO | 2018/181708 A1 | 10/2018 |

* cited by examiner

CIRCUIT MODULE

CROSS REFERENCE TO RELATED APPLICATION

This is a continuation of International Application No. PCT/JP2021/035422 filed on Sep. 27, 2021 which claims priority from Japanese Patent Application No. 2020-167857 filed on Oct. 2, 2020. The contents of these applications are incorporated herein by reference in their entireties.

BACKGROUND OF THE DISCLOSURE

Field of the Disclosure

The present disclosure relates to a circuit module in which at least one of electronic components mounted on a substrate is electrically connected to the substrate by a wire.

Description of the Related Art

There is known a circuit module including a substrate and an electronic component such as an inductor or an integrated circuit, in which an electrode of the electronic component mounted on the substrate and an electrode of the substrate are connected to each other via a wire by wire bonding or the like.

It is known to provide a shield that shields electromagnetic waves around an electronic component. The shield reduces entry of the electromagnetic wave from the outside into the electronic component. Furthermore, the shield reduces leakage of the electromagnetic wave generated in the electronic component to the outside.

It is known to use a wire as the above-described shield. For example, Patent Document 1 discloses a module package including a plurality of wires covering an electronic component.

Patent Document 1: US 2018/324940 A

BRIEF SUMMARY OF THE DISCLOSURE

In the module package disclosed in Patent Document 1, each wire covering an electronic component is connected to a substrate at two points of one end portion and the other end portion of the wire. A pad needs to be formed at the connection points of the substrate with the wire. That is, two pads need to be formed on the substrate for each wire. That is, in order to connect all the wires to the substrate, a large number of pads need to be formed on the substrate. Therefore, many of areas on the substrate are occupied by these pads. This may reduce an area for mounting the electronic component in the area on the substrate.

Therefore, a possible benefit of the present disclosure is to solve the above problems, and to provide a circuit module capable of suppressing a decrease in an area for mounting an electronic component on a substrate even when a wire for shielding the electronic component is connected to the substrate.

In order to achieve the above possible benefit, the present disclosure is configured as follows.

A circuit module according to an aspect of the present disclosure includes: a substrate; a first component mounted on the substrate and including a ground terminal on an upper surface; first wires that connect the ground terminal to the substrate; and a second component mounted on the substrate, in which overlapping first wires in plan view.

According to the present disclosure, even when a wire for shielding an electronic component is connected to a substrate, it is possible to suppress a decrease in an area for mounting the electronic component on the substrate.

DETAILED DESCRIPTION OF THE DISCLOSURE

Figure 1:
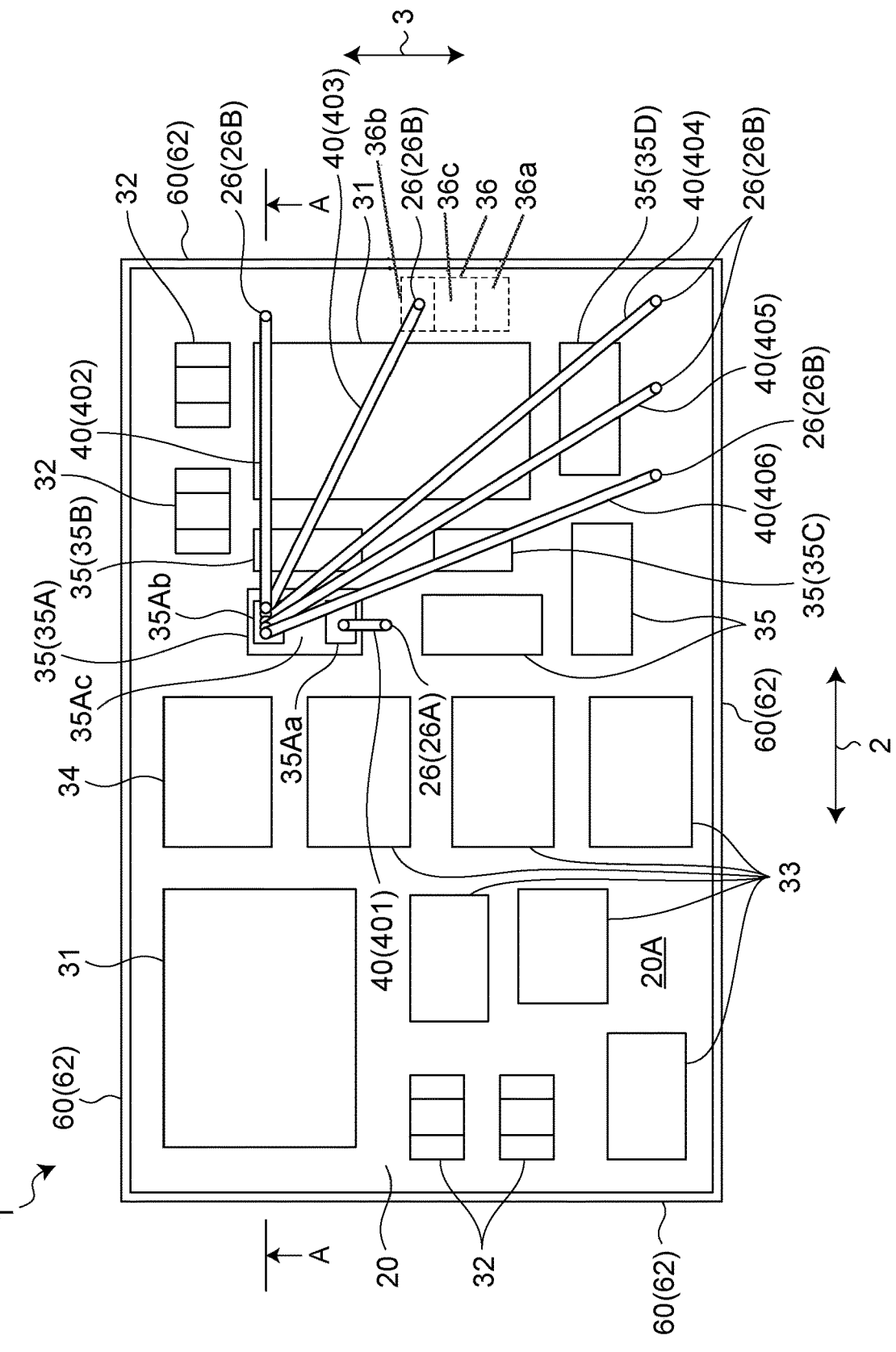
FIG. 1 is a plan view of a circuit module according to a first embodiment of the present disclosure.

A circuit module according to an aspect of the present disclosure is a circuit module including: a substrate; a first component mounted on the substrate and including a ground terminal on an upper surface; a plurality of first wires; and a second component mounted on the substrate and overlapping at least one of the plurality of first wires in plan view, in which each of the plurality of first wires connects the ground terminal of the first component to the substrate.

According to this configuration, the second component overlaps the first wire in plan view. Thus, the second component can be shielded by the first wire.

Furthermore, according to this configuration, the first wire is connected to the ground terminal of the first component and the substrate. That is, the first wire is connected to the substrate at one point. Therefore, the number of pads formed on the substrate can be reduced as compared with the configuration in which the wire is connected to the substrate at two points. As a result, it is possible to suppress a decrease in an area for mounting components such as the first component and the second component on the substrate.

Furthermore, according to this configuration, the plurality of first wires are connected to one first component. Therefore, the number of pads formed on the substrate can be reduced.

Furthermore, according to this configuration, since the plurality of first wires are connected to the same ground terminal, the ground potentials of the plurality of first wires can be set to the same potential. That is, variations in the ground potential of the plurality of first wires can be reduced.

A circuit module according to an aspect of the present disclosure may include a plurality of the first components, and at least one of the first wires may be connected to each of ground terminals of a plurality of the first components. According to this configuration, the second component can be shielded by a large number of first wires. Accordingly, the shielding effect for the second component can be enhanced. Furthermore, each of the plurality of first components is mounted at a different position. Therefore, the second component can be shielded with high density by the first wires extending from various positions.

The first wires connected to the different first components may intersect with each other in plan view. According to this configuration, since the plurality of first wires intersect with each other, the density of the plurality of first wires can be increased. Accordingly, the shielding effect for the second component can be enhanced.

The first component may be an inductor. For example, a large number of inductors are arranged around a low noise amplifier (LNA), which is a type of component mounted on a substrate. Among these inductors, an inductor connected to the ground can be used as the first component.

The second component may be an element constituting a matching circuit. For example, around a low noise amplifier (LNA), which is a type of component mounted on a substrate, a large number of elements constituting a matching circuit of the LNA are arranged. These elements can be shielded by the first wires.

A circuit module according to an aspect of the present disclosure may include a third component mounted on the substrate and including a ground terminal on an upper surface, and the first wires may be connected to the substrate via the third component by being connected to the ground terminal of the third component. According to this configuration, the first wires are connected to the first component and the third component. That is, the first wires are not directly connected to the substrate. Therefore, it is not necessary to form a pad for connecting the first wires on the substrate.

The ground terminal of the first component may be electrically connected to an electrode disposed on the substrate via a through hole penetrating the first component. According to this configuration, even a component including a terminal only on a lower surface can function as the first component by providing the through hole and providing the terminal on the upper surface.

A circuit module according to an aspect of the present disclosure may include a support component that is mounted on the substrate and supports the first component, and the first component may be mounted on the substrate via the support component by being supported by the support component. According to this configuration, since the first component is supported by the support component, the first wires extending from the first component can be positioned at a high position. As a result, the possibility that the first wires come into contact with the second component can be reduced.

A circuit module according to an aspect of the present disclosure may include a second wire that connects the second component to the substrate, the second component may include a terminal to which the second wire is connected on an upper surface, and the second wire may not intersect the first wires which are at positions overlapping the second component in plan view. According to this configuration, when the second wire is connected to the ground, the second wire has a function of shielding the second component similarly to the first wires. According to this configuration, the first wires covering the second component and the second wire extending from the second component do not intersect directly above the second component. As a result, it is easy to arrange the first wires and the second wire substantially parallel to each other directly above the second component. As a result, since a region close to a surface can be formed by the first wires and the second wire, the shielding effect for the second component can be enhanced.

A circuit module according to an aspect of the present disclosure may include a second wire that connects the second component to the substrate, the second component may include a terminal to which the second wire is connected on an upper surface, and the second wire may extend from the terminal so as to be separated from the first wires which are at positions overlapping the second component in plan view. According to this configuration, in a step of connecting the first wires to the first component or the substrate, the connection can be less likely to be blocked by the second wire extending from the second component. Furthermore, it is possible to reduce the possibility of connection of the second wire to the second component or the substrate to be blocked by the first wires extending from the first component.

In a direction orthogonal to a mounting surface of the substrate on which the first component and the second component are mounted, the ground terminal of the first component may be farther from the mounting surface than the second component. According to this configuration, the first wires connected to the ground terminal of the first component can be prevented from interfering with the second component.

First Embodiment

Figure 2:
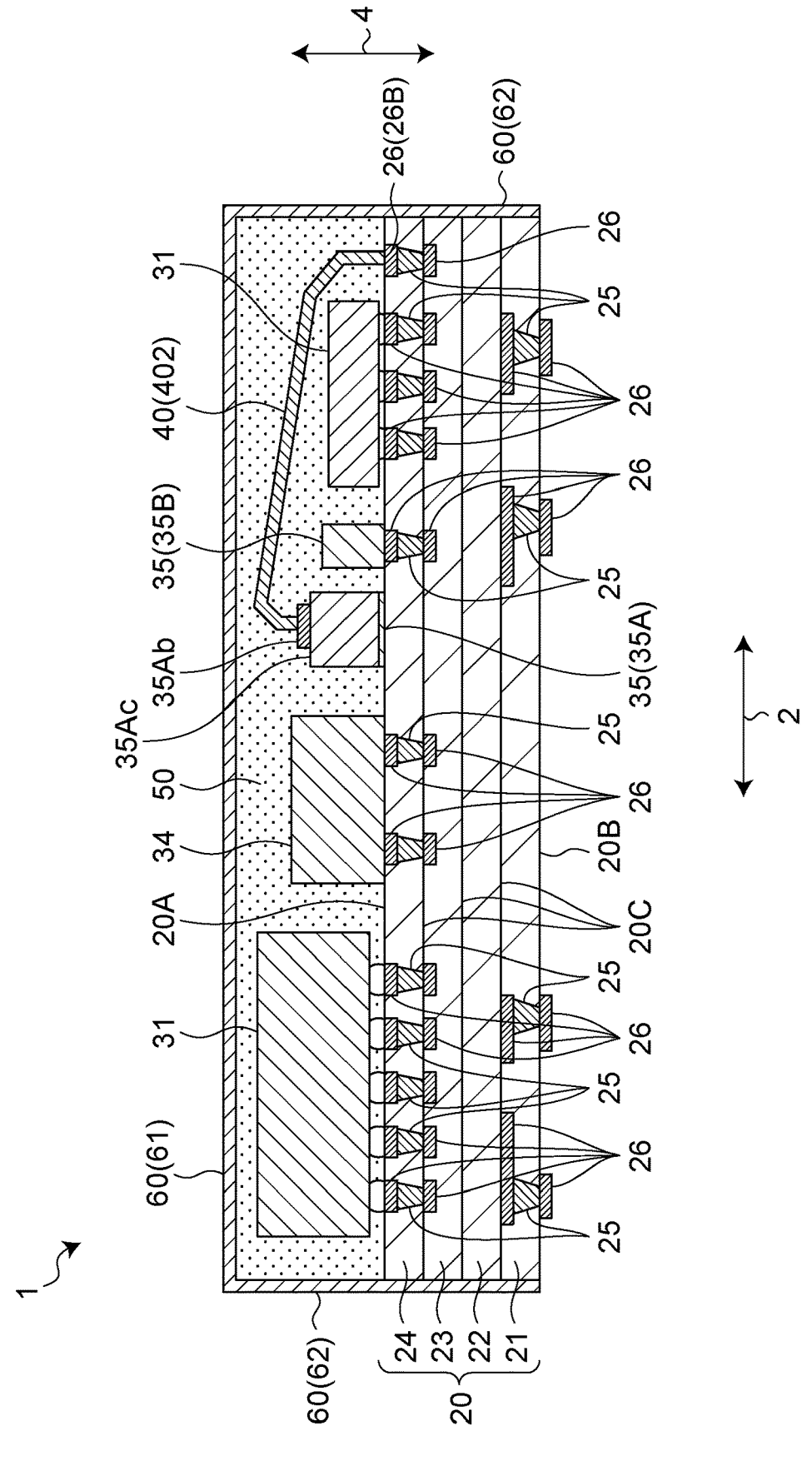
FIG. 2 is a cross-sectional view taken along line A-A in FIG. 1.

FIG. 1 is a plan view of a circuit module according to a first embodiment of the present disclosure. FIG. 2 is a cross-sectional view taken along the line A-A in FIG. 1.

In a circuit module 1, various electronic components are mounted on a surface of a substrate, and an insulating resin layer is formed on the surface of the substrate so as to wrap the electronic components. The circuit module 1 is used for, for example, wireless devices such as mobile phones and automobile phones, and other various communication devices.

As illustrated in FIGS. 1 and 2, the circuit module 1 includes a substrate 20, electronic components 31 to 35, wires 40, a sealing resin 50, and a shield film 60. Note that, in FIG. 1 and FIGS. 3, 5, 7, and 8 to be described later, illustration of an upper film 61 of the shield film 60 and the sealing resin 50 is omitted.

The circuit module 1 has a rectangular parallelepiped shape as a whole. In the following description, directions of respective sides of the circuit module 1 having a rectangular parallelepiped shape are defined as a longitudinal direction 2, a lateral direction 3, and a height direction 4, respectively. A side of the shield film 60 on which the upper film 61 (see FIG. 2) is located is defined as an upper side in the height direction 4. Note that the shape of the circuit module 1 is not limited to a rectangular parallelepiped shape.

The substrate 20 is made of resin such as glass epoxy, Teflon (registered trademark), and paper phenol, ceramic such as alumina, or the like.

In the first embodiment, as illustrated in FIG. 2, the substrate 20 is a four-layer substrate in which four substrates 21, 22, 23, and 24 are stacked in order from a bottom. Note that the substrate 20 may be a multilayer substrate having a number of layers other than four, or may be a single-layer substrate.

A via conductor 25 is formed in the substrate 20. A plurality of the via conductors 25 are formed in the substrate 20. The via conductors 25 are formed in the substrates 21 and 24. Note that the via conductors 25 may be formed in the substrates 22 and 23 or may not be formed in the substrates 21 and 24. In the case of a resin substrate, each of the via conductors 25 is formed by plating a conductive metal made of copper or the like in a through hole (via) vertically penetrating the substrates 21, 22, 23, and 24, or in the case of a ceramic substrate, the via conductor is filled with a conductive paste and co-fired with a ceramic.

A wiring electrode 26 is formed on the substrate 20. A plurality of the wiring electrodes 26 are formed on the substrate 20. The wiring electrodes 26 are formed on a surface 20A of the substrate 20 (an upper surface of the substrate 24), a back surface 20B of the substrate 20 (a lower surface of the substrate 21), and an inner surface 20C sandwiched between two adjacent substrates among the substrates 21, 22, 23, and 24. Note that, in the first embodiment, the wiring electrodes 26 are not formed on the inner surface 20C located at a center in the height direction 4 among the three inner surfaces 20C. In FIG. 1 (and FIGS. 3, 5, 7, and 8 to be described later), the wiring electrodes 26 formed on the surface 20A of the substrate 20 are indicated by a circular shape. However, in practice, each of the wiring electrodes 26 is a pad having the same size as that illustrated in the cross-sectional view of FIG. 2 (and FIGS. 4 and 6 to be described later). The pad has, for example, a rectangular shape in plan view, but may have another shape.

In the case of a ceramic substrate, the wiring electrode 26 is obtained by printing a conductive paste on a pad formed on each surface (the surface 20A, the back surface 20B, the inner surface 20C) of the substrate 20 and co-firing the paste with the ceramic substrate. The conductive paste is made of, for example, copper. In the case of a resin substrate, the wiring electrode 26 is formed on a pad on each surface of the substrate 20 by a known means such as etching a metal foil. Each wiring electrode 26 is electrically connected to another wiring electrode 26 via the via conductor 25. At least a part of the wiring electrode 26 formed on the back surface 20B of the substrate 20 is a terminal electrode. In a case where the circuit module 1 is mounted on a substrate or the like (not illustrated), the terminal electrode is connected to a wiring electrode formed on the substrate or the like.

As illustrated in FIG. 1, 19 electronic components 31 to 35 are mounted on the surface 20A of the substrate 20. In the first embodiment, the 19 electronic components 31 to 35 are two integrated circuits 31 (for example, an LNA or a power amplifier (PA)), four filter components 32, six capacitors 33, one antenna element 34, and six inductors 35.

Note that the arrangement positions of the electronic components mounted on the substrate 20 are not limited to the arrangement positions illustrated in FIG. 1. Furthermore, the number of electronic components mounted on the substrate 20 is not limited to 19. The number of each of the integrated circuit 31, the filter component 32, the capacitor 33, the antenna element 34, and the inductor 35 mounted on the substrate 20 is not limited to the number described above. Types of the electronic components 30 are not limited to those described above (the integrated circuit 31, the filter component 32, the capacitor 33, the antenna element 34, and the inductor 35), and various known electronic components can be mounted on the substrate 20. The electronic components 30 may be mounted on the back surface 20B of the substrate 20.

The electronic components 30 are mounted on the substrate 20 by various known mounting methods. In the first embodiment, one inductor 35A is mounted on the substrate 20 by wire bonding. That is, the inductor 35A is connected to the wiring electrode 26 via the wire 40. The inductor 35A is an example of the first component. The electronic components 30 other than the inductor 35A are mounted on the substrate 20 by a mounting method not via the wire 40, for example, by flip-chip bonding.

Note that the electronic components 30 other than the inductor 35A may be mounted on the substrate 20 by wire bonding.

The wiring of the wire 40 will be described in detail later.

As illustrated in FIG. 2, the sealing resin 50 is provided on the surface 20A of the substrate 20. The sealing resin 50 is made of an electrically insulated resin such as an epoxy resin.

The sealing resin 50 covers the electronic components 31 to 35. In the first embodiment, the electronic components 31 to 35 are completely embedded in the sealing resin 50.

Note that the sealing resin 50 may cover only a part of each of the electronic components 30. For example, while a small electronic component is completely embedded in the sealing resin 50, a portion of a large electronic component other than an upper surface thereof may be embedded in the sealing resin 50.

The shield film 60 is provided so as to cover the substrate 20 and the sealing resin 50 from above. As illustrated in FIG. 1, the shield film 60 surrounds the plurality of electronic components 31 to 35 mounted on the substrate 20 in plan view. The shield film 60 is made of a conductive member such as copper.

As illustrated in FIGS. 1 and 2, the shield film 60 includes the upper film 61 and a side film 62. The side film 62 extends downward from a peripheral edge of the upper film 61. That is, the shield film 60 has a box shape opened downward. The upper film 61 is in contact with an upper surface of the sealing resin 50. That is, the upper film 61 covers an upper side of the sealing resin 50. The side film 62 is in contact with a side surface of the sealing resin 50 and a side surface of the substrate 20. That is, the side film 62 covers a side of the sealing resin 50 and a side of the substrate 20. As described above, the shield film 60 covers the side of the substrate 20 and the side and the upper side of the sealing resin 50.

The shield film 60 is grounded by being directly or indirectly connected to a casing of a device including the circuit module 1. That is, a potential of the shield film 60 is the ground potential.

Note that the shield film 60 may cover at least a part of the sealing resin 50. For example, the shield film 60 may not include the side film 62. In this case, the shield film 60 covers the upper side of the sealing resin 50 but does not cover the side of the sealing resin 50.

Hereinafter, the wiring of the wire 40 will be described.

In the first embodiment, the circuit module 1 includes six wires 40 as illustrated in FIG. 1. The six wires 40 include one wire 401 and five wires 402 to 406.

The inductor 35A includes two terminals 35Aa and 35Ab. The terminals 35Aa and 35Ab are formed on an upper surface 35Ac of the inductor 35A. As illustrated in FIG. 2, the terminals 35Aa and 35Ab are located above the inductors 35B, 35C, and 35D. In other words, in the height direction 4, the terminals 35Aa and 35Ab are farther from the surface 20A of the substrate 20 than the inductors 35B, 35C, and 35D. The surface 20A of the substrate 20 is an example of the mounting surface. The height direction 4 is orthogonal to the surface 20A.

As illustrated in FIG. 1, the wire 401 connects the terminal 35Aa to the substrate 20 (specifically, a wiring electrode 26A formed on the substrate 20). The wiring electrode 26A is one of the plurality of wiring electrodes 26. The wiring electrode 26A is electrically connected to a component other than the ground (for example, other electronic components 30 and power supplies). That is, the terminal 35Aa is connected to a circuit (other than the ground) via the wire 401.

The wires 402 to 406 connects the terminal 35Ab to the substrate 20 (specifically, a wiring electrode 26B formed on the substrate 20). The wiring electrode 26B is a part of the plurality of wiring electrodes 26, and is connected to the ground electrode of the substrate 20. Furthermore, as another form, the wiring electrode 26B may be electrically connected to the ground by being connected to the shield film 60 or the like. That is, the terminal 35Ab is connected to the ground via the wires 402 to 406. That is, the inductor 35A is connected to the ground. The wires 402 to 406 are an example of the first wires. The terminal 35Ab is an example of the ground terminal. In FIG. 1 (and FIGS. 3, 5, 7, and 8 to be described later), the wiring electrode 26B is individually formed for each of the wires 402 to 406, but may be formed in common for the plurality of wires 40. For example, instead of the five wiring electrodes 26B illustrated in FIG. 1, one wiring electrode may be formed over the entire region where the five wiring electrodes 26B are formed, and the five wires 402 to 406 may be connected to the one wiring electrode.

One end portions of the wires 402 to 406 are connected to the terminal 35Ab. That is, the five wires 402 to 406 are connected to the terminal 35Ab.

Each of the wires 402 to 406 extends from the terminal 35Ab in a different direction. The other end portions of the wires 402 to 406 are connected to the wiring electrodes 26B at different positions on the surface 20A of the substrate 20.

The wires 402 to 406 extend from the terminal 35Ab to the wiring electrodes 26B through directly above shield target components of the electronic components 30. In the first embodiment, the shield target components are three inductors 35B, 35C, and 35D. In the first embodiment, the inductors 35B, 35C, and 35D are elements constituting a matching circuit of the integrated circuit 31 disposed nearby, and are not connected to the ground. The inductors 35B, 35C, and 35D are examples of the second component. Furthermore, in this case, the inductor 35A is a wire bonding type inductor, and each of the inductors 35B, 35C, and 35D is an inductor that joins an electrode on a bottom surface of the component and the wiring electrode 26 together by soldering.

In plan view, the wires 402, 403, 404, and 405 overlap the inductor 35B. Furthermore, the wire 406 overlaps the inductor 35C in plan view. Furthermore, the wires 404 and 405 overlap the inductor 35D in plan view. As a result, the upper sides of the inductors 35B, 35C, and 35D are shielded by at least one of the wires 402 to 406. Therefore, FIG. 1 is a diagram in which the wires 402 to 405 also cover the integrated circuit 31 (LNA) other than the inductors 35B, 35C, and 35D, but the wires 402 to 406 may cover only the upper parts of the inductors 35B, 35C, and 35D.

Furthermore, the sides of the inductors 35B, 35C, and 35D can be shielded by at least one of the wires 402 to 406. For example, as illustrated in FIG. 2, the wire 402 is located on both sides of the inductor 35B in the longitudinal direction 2. In this case, both sides of the inductor 35B in the longitudinal direction 2 are shielded by the wire 402.

According to the first embodiment, the inductors 35B to 35D overlap at least one of the wires 402 to 406 in plan view. Thus, the inductors 35B to 35D can be shielded by at least one of the wires 402 to 406.

According to the first embodiment, the wires 402 to 406 are connected to the terminal 35Ab of the inductor 35A and the substrate 20. That is, the wires 402 to 406 are connected to the substrate 20 at one point. Therefore, the number of pads formed on the substrate 20 can be reduced as compared with the embodiment in which the wires are connected to the substrate 20 at two points. As a result, it is possible to suppress a decrease in an area for mounting the electronic components 30 on the substrate 20.

According to the first embodiment, the plurality of wires 402 to 406 are connected to the terminal 35Ab of one inductor 35A. Therefore, the number of pads formed on the substrate 20 can be reduced.

According to the first embodiment, since the plurality of wires 402 to 406 are connected to the same ground terminal, the ground potentials of the plurality of wires 402 to 406 can be set to the same potential. That is, variations in the ground potential of the plurality of wires 402 to 406 can be reduced.

For example, a large number of inductors are arranged around a low noise amplifier (LNA), which is a type of the component 31 mounted on the substrate 20. Among these inductors, the wires 402 to 406 can be connected to the one (for example, the inductor 35A) connected to the ground.

Furthermore, for example, around a low noise amplifier (LNA), which is a type of the component 31 mounted on the substrate 20, a large number of elements constituting a matching circuit of the LNA are arranged. These elements (e.g., inductors 35B to 35D) can be shielded by the wires 402 to 406.

According to the first embodiment, the terminals 35Aa and 35Ab are located above the inductors 35B, 35C, and 35D. Therefore, the wires 402 to 406 connected to the terminals 35Aa and 35Ab can be prevented from interfering with the inductors 35B, 35C, and 35D.

In the first embodiment, the number of wires 40 extending from the terminal 35Aa of the electronic component (inductor 35A) mounted on the substrate 20 by wire bonding is one (wire 401), and the number of wires 40 extending from the terminal 35Ab is five (wires 402 to 406). However, the number of wires 40 extending from the terminal 35Aa is not limited to one, and the number of wires 40 extending from the terminal 35Ab is not limited to five.

In the first embodiment, the inductor 35A is mounted on the substrate 20 by wire bonding. That is, the inductor 35A corresponds to the first component. However, an inductor 35 other than the inductor 35A may be mounted on the substrate 20 by wire bonding, or an electronic component other than the inductor 35 such as the capacitor 33 may be mounted. That is, an electronic component other than the inductor 35A may correspond to the first component.

In the first embodiment, the components to be shielded are the inductors 35B to 35D. That is, the inductors 35B to 35D correspond to the second component. However, the shield target component may be the inductor 35 other than the inductors 35B to 35D, or may be an electronic component other than the inductor 35 such as the capacitor 33. That is, an electronic component other than the inductors 35B to 35D may correspond to the second component.

Second Embodiment

Figure 3:
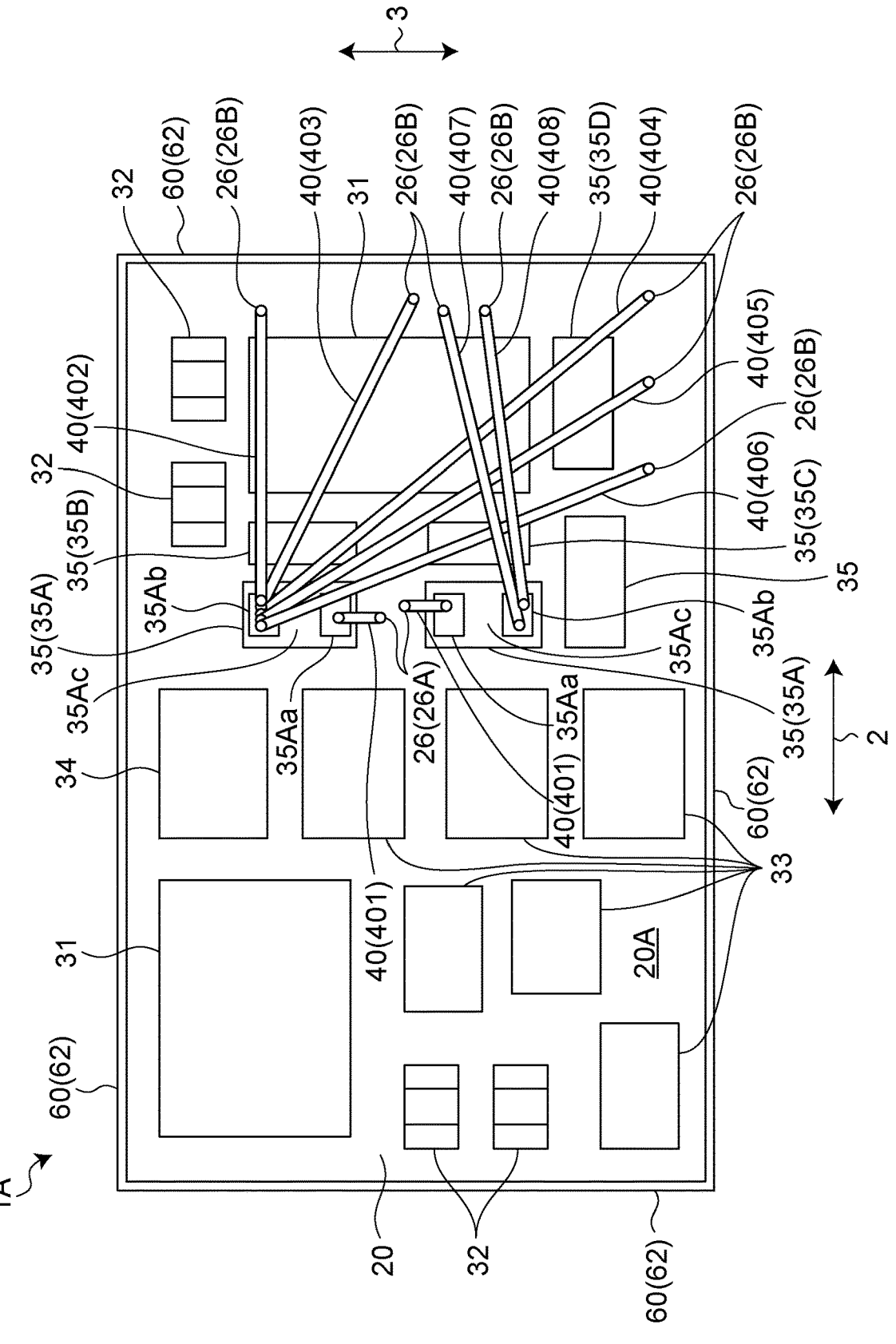
FIG. 3 is a plan view of a circuit module according to a second embodiment of the present disclosure.

FIG. 3 is a plan view of a circuit module according to a second embodiment of the present disclosure. A circuit module 1A according to the second embodiment is different from the circuit module 1 according to the first embodiment in that the circuit module 1A according to the second embodiment includes a plurality of inductors 35A.

As illustrated in FIG. 3, the circuit module 1A according to the second embodiment includes two inductors 35A. Note that the circuit module 1A may include three or more inductors 35A.

Similarly to the first embodiment, each of the inductors 35A includes two terminals 35Aa and 35Ab. A wire 401 extends from the terminal 35Aa of each of the inductors 35A. Each wire 401 is electrically connected to a wiring electrode 26A. At least one wire extends from the terminal 35Ab of each of the inductors 35A. In the second embodiment, five wires 402 to 406 extend from one terminal 35Ab of the two inductors 35A, and two wires 407 and 408 extend from the other terminal 35Ab of the two inductors 35A. Each of the wires 402 to 408 extending from the terminals 35Ab is electrically connected to the wiring electrode 26B.

The wires 404 to 406 and the wires 407 and 408 intersect with each other in plan view. That is, in plan view, the wires 404 to 406 connected to one of the two inductors 35A and the wires 407 and 408 connected to the other of the two inductors 35A intersect with each other. That is, the wires connected to different inductors 35A intersect with each other in plan view. Note that intersecting is not limited to the wires 404 to 406 and the wires 407 and 408.

According to the second embodiment, the wires extend from each of the plurality of inductors 35A. As a result, the inductors 35B to 35D can be shielded by a large number of wires 402 to 408. As a result, the shielding effect for the inductors 35B to 35D can be enhanced. Furthermore, each of the plurality of inductors 35A is mounted at a different position. Therefore, the inductors 35B to 35D can be shielded with high density by the wires 402 to 408 extending from various positions.

According to the second embodiment, since the wires 404 to 406 and the wires 407 and 408 intersect with each other, the density of the plurality of wires 404 to 408 can be increased. As a result, the shielding effect for the inductors 35B to 35D can be enhanced.

Third Embodiment

A circuit module according to a third embodiment is different from the circuit module 1 according to the first embodiment in that the other end portion of the wire 403 is not connected to the wiring electrode 26B.

The circuit module according to the third embodiment includes a filter component 36 as indicated by a broken line in FIG. 1 in addition to the electronic components 31 to 35 included in the circuit module 1 according to the first embodiment. The filter component 36 has the same configuration as the filter component 32, and is mounted on the surface 20A of the substrate 20. The filter component 36 is an example of the third component. Note that the third component is not limited to the filter component, and may be another type of electronic component such as an inductor or a capacitor.

The filter component 36 includes two terminals 36a and 36b. The terminals 36a and 36b are formed from an upper surface 36c to a lower surface of the filter component 36.

The terminal 36a is electrically connected to a wiring electrode 26A on the lower surface of the filter component 36.

The terminal 36b is electrically connected to a wiring electrode 26B electrically connected to the ground on the lower surface of the filter component 36. That is, the terminal 36b functions as a ground terminal.

According to the third embodiment, the wire 403 is connected to the inductor 35A and the filter component 36.

That is, the wire 403 is not directly connected to the substrate 20. Therefore, it is not necessary to form a pad for connecting the wire 403 on the substrate.

In the third embodiment, the circuit module includes one filter component 36 as an electronic component having a terminal to which the other end portion of the wire 40 is connected. However, the circuit module may include a plurality of filter components 36 as an electronic component having a terminal to which the other end portion of the wire 40 is connected.

In the third embodiment, one wire 40 is connected to the terminal 36b of the filter component 36. However, a plurality of the wires 40 may be connected to the terminal 36b of the filter component 36.

Fourth Embodiment

Figure 4:
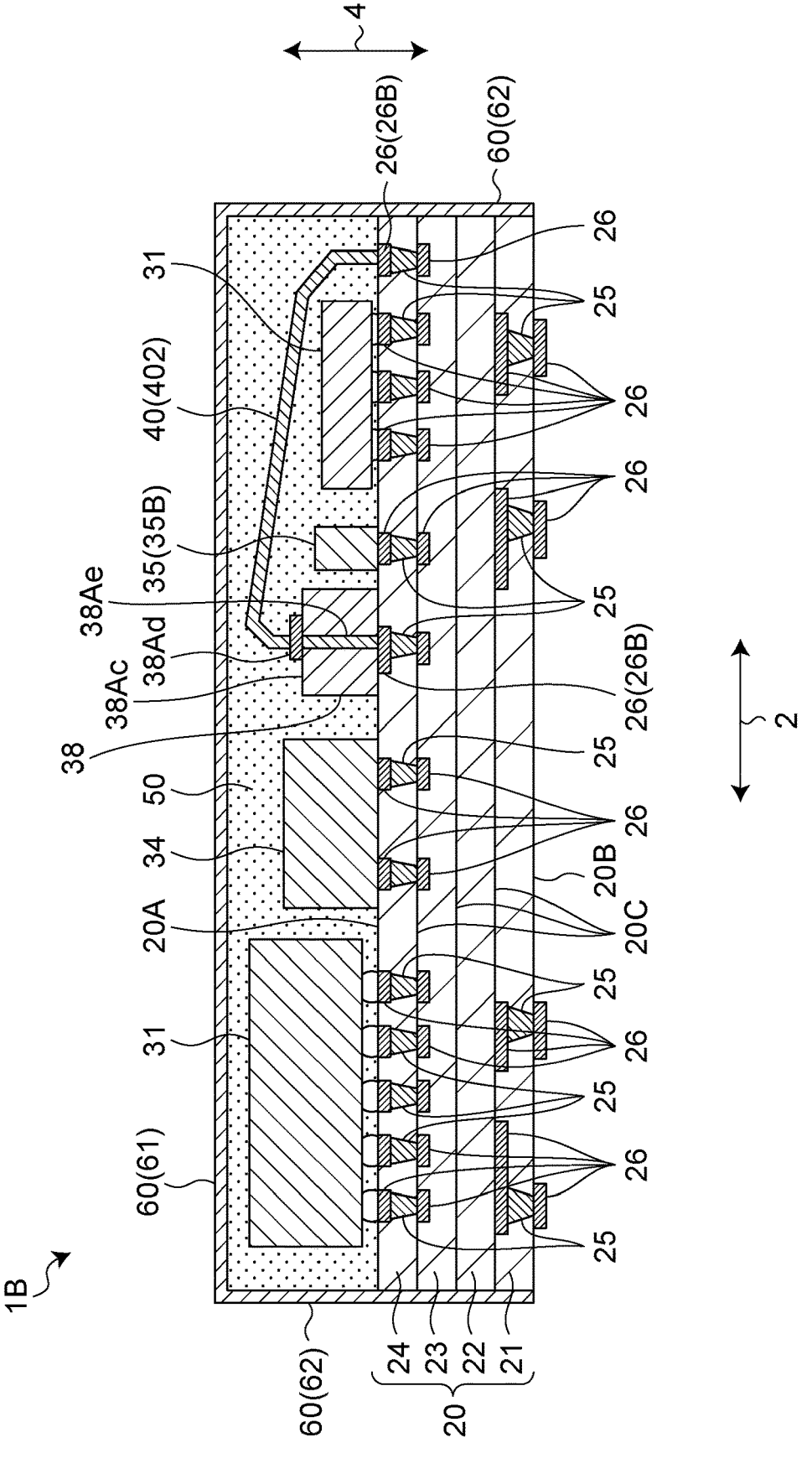
FIG. 4 is a cross-sectional view of a circuit module according to a fourth embodiment of the present disclosure.

FIG. 4 is a plan view of a circuit module according to a fourth embodiment of the present disclosure. A circuit module 1B according to the fourth embodiment is different from the circuit module 1 according to the first embodiment in that an integrated circuit 38 as a first component is not mounted on a substrate 20 by wire bonding.

As illustrated in FIG. 4, the integrated circuit 38 included in the circuit module 1B according to the fourth embodiment is connected to at least one wiring electrode 26 formed on a surface 20A of the substrate 20. That is, the integrated circuit 38 is mounted on the substrate 20 by a mounting method such as flip-chip bonding without involving a wire.

In the fourth embodiment, the integrated circuit 38 is subjected to through-silicon via (TSV) processing. That is, in the fourth embodiment, a terminal 38Ad is formed on an upper surface 38Ac of the integrated circuit 38. Furthermore, a through hole 38Ae is formed in the integrated circuit 38. The through hole 38Ae is filled with a conductor. One end portion of the through hole 38Ae communicates with the terminal 38Ad. The other end of the through hole 38Ae communicates with a wiring electrode 26. That is, the terminal 38Ad is electrically connected to the wiring electrode 26 via the through hole 38Ae.

In the fourth embodiment, wires 402 to 406 connect the terminal 38Ad to the substrate 20 (specifically, a wiring electrode 26B formed on the substrate 20). Note that FIG. 4 illustrates only the wire 402 among the wires 402 to 406. The terminal 38Ad is connected to the wiring electrode 26B via the wires 402 to 406. Here, as described above, the wiring electrode 26B is electrically connected to the ground. That is, the terminal 38Ad functions as a ground terminal.

Note that the wiring electrode 26 electrically connected to the terminal 38Ad via the through hole 38Ae may be the wiring electrode 26B electrically connected to the ground. In this case, the other end portions of the wires 402 to 406 may not be connected to the wiring electrode 26B. This is because one end portions of the wires 402 to 406 are connected to the wiring electrode 26B via the terminal 38Ad and the through hole 38Ae.

As described above, the electronic component (the integrated circuit 38 in the case of the fourth embodiment) corresponding to the first component only needs to have a terminal functioning as a ground terminal on the upper surface thereof. That is, a method of mounting the electronic component corresponding to the first component is not limited to wire bonding.

According to the fourth embodiment, even a component having a terminal only on the lower surface can function as a component that shields other components (for example, the inductor 35B) by providing the through hole 35Ae and providing the terminal 35Ad on the upper surface.

Fifth Embodiment

Figure 5:
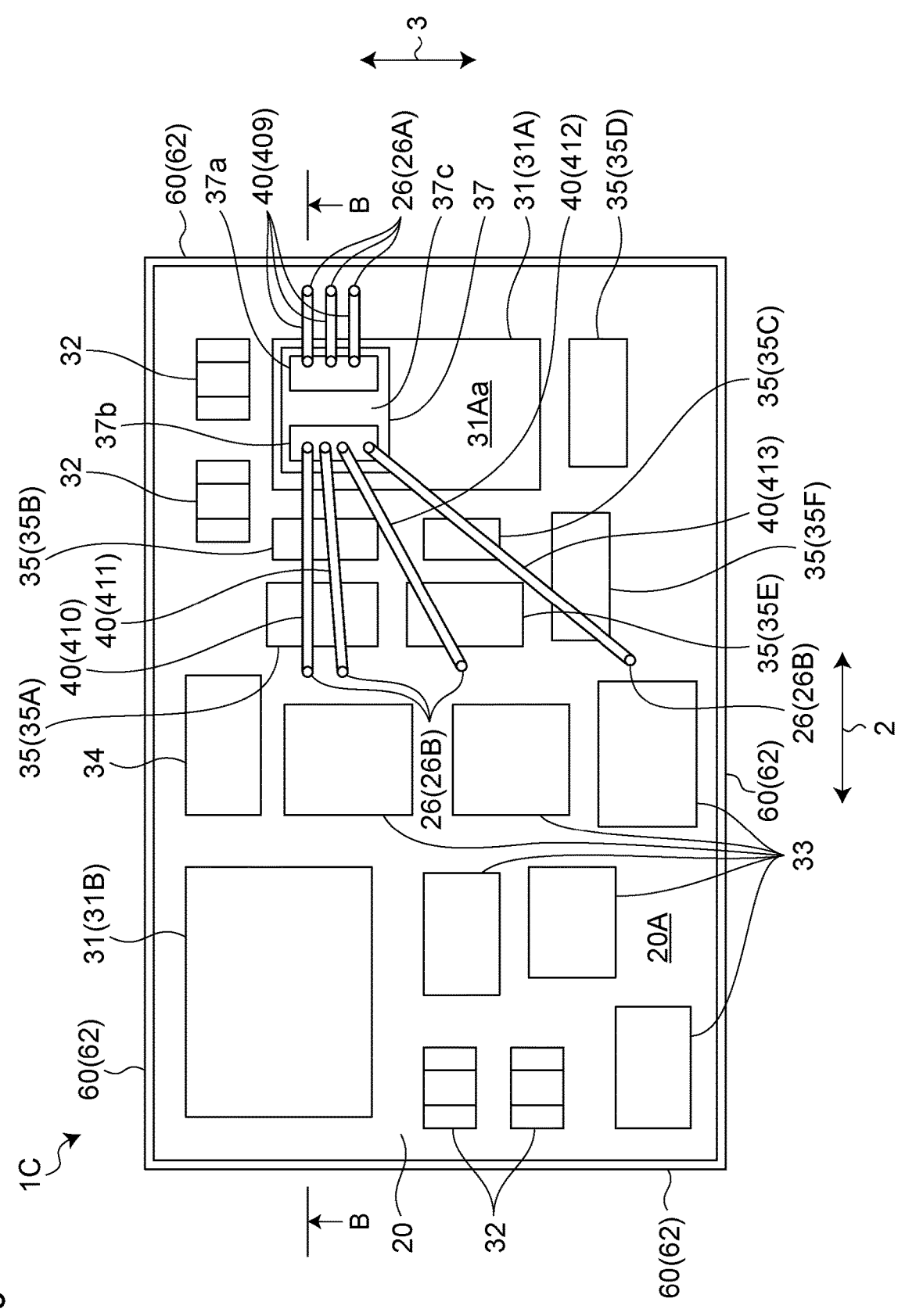
FIG. 5 is a plan view of a circuit module according to a fifth embodiment of the present disclosure.
Figure 6:
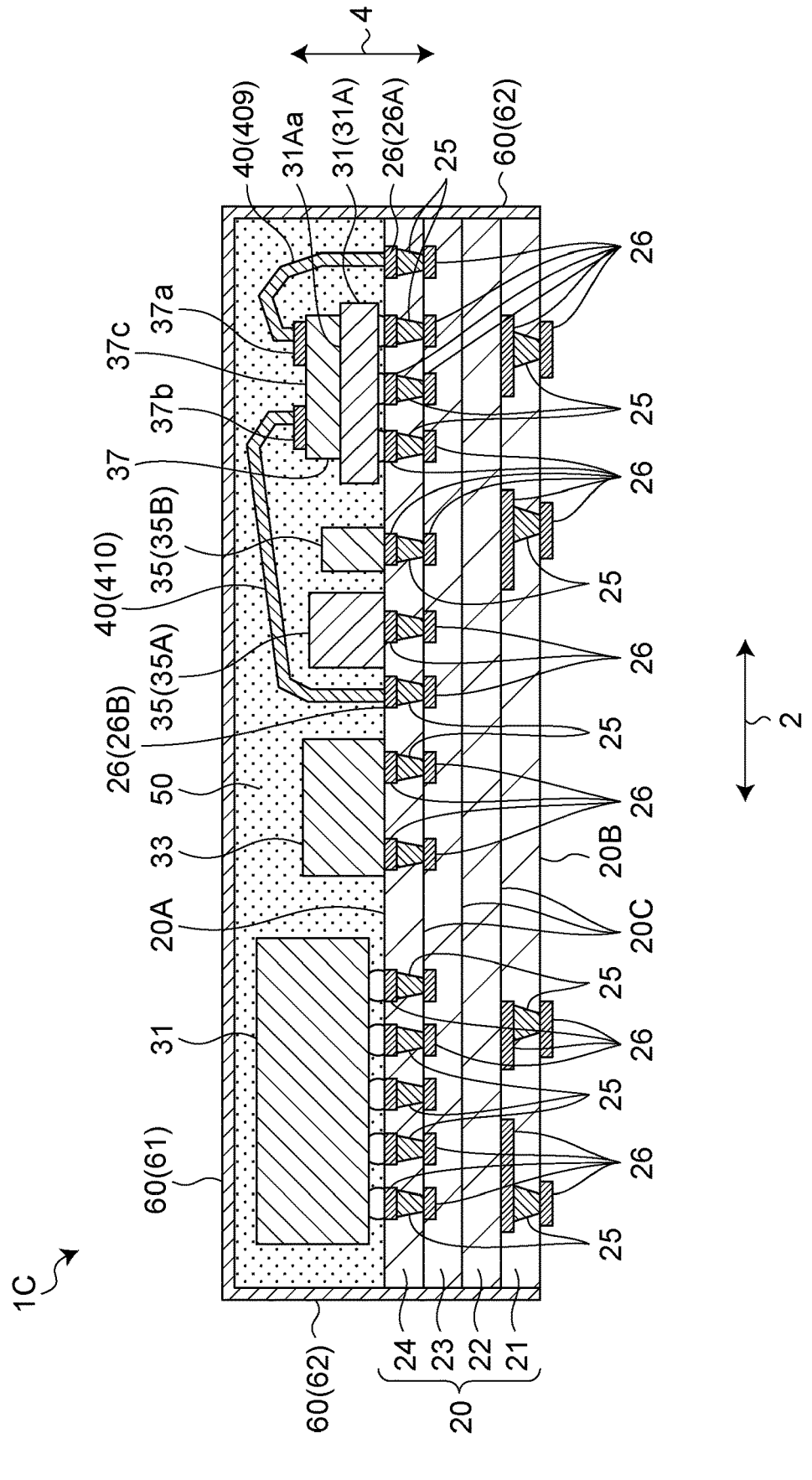
FIG. 6 is a cross-sectional view taken along line B-B in FIG. 5.

FIG. 5 is a plan view of a circuit module according to a fifth embodiment of the present disclosure. FIG. 6 is a cross-sectional view taken along the line B-B in FIG. 5. A circuit module 1C according to the fifth embodiment is different from the circuit module 1 according to the first embodiment in that an electronic component 37 corresponding to the first component is supported by another electronic component.

As illustrated in FIG. 5, the electronic component 37 is supported on an upper surface 31Aa of an integrated circuit 31A among integrated circuits 31, which is mounted on a right end portion of a substrate 20 on the sheet of FIG. 5. That is, the electronic component 37 is mounted on the substrate 20 via the integrated circuit 31A.

In the fifth embodiment, the electronic component 37 is an inductor. Note that the electronic component 37 is not limited to an inductor, and may be another type of electronic component such as a resistor, a capacitor, or an integrated circuit. The electronic component 37 is an example of the first component. The integrated circuit 31A is an example of the support component. The electronic component 37 may be supported by a component other than the integrated circuit 31A. For example, the electronic component 37 may be supported by an integrated circuit 31B mounted on an upper left end portion of the substrate 20 on the sheet of FIG. 5. In this case, the integrated circuit 31B corresponds to the support component.

Hereinafter, the wiring of the wire 40 will be described.

In the fifth embodiment, the circuit module 1C includes seven wires 40. The seven wires 40 include three wires 409 and four wires 410 to 413.

The electronic component 37 includes two terminals 37a and 37b. The terminals 37a and 37b are formed on an upper surface 37c of the electronic component 37.

Each of the three wires 409 connects the terminal 37a to the substrate 20 (specifically, a wiring electrode 26A formed on the substrate 20). That is, the terminal 37a is electrically connected to a component other than the ground (for example, other electronic components 30 and power supplies) via the wire 409.

Each of the four wires 410 to 413 connects the terminal 37b to the substrate 20 (specifically, a wiring electrode 26B formed on the substrate 20). That is, the terminal 37b is connected to the ground via the wires 410 to 413. The wires 410 to 413 is an example of the first wires. The terminal 37b is an example of the ground terminal.

One end portions of the wires 410 to 413 are connected to the terminal 37b. That is, the four wires 410 to 413 are connected to the terminal 37b.

Each of the wires 410 to 413 extends from the terminal 37b in a different direction. The other end portions of the wires 410 to 413 are connected to wiring electrodes 26B which are at different positions on a surface 20A of the substrate 20. Each of the wiring electrodes 26B is a ground terminal of the substrate 20.

The wires 410 to 413 extend from the terminal 37b to the wiring electrodes 26B through directly above shield target components of the electronic components 30. In the fifth embodiment, the shield target components are five inductors 35A, 35B, 35C, 35E, and 35F. The inductors 35A, 35B, 35C, 35E, and 35F are examples of the second component.

In plan view, the wires 410 and 411 overlaps the inductors 35A and 35B. Furthermore, the wire 412 overlaps the inductor 35E in plan view. Furthermore, the wire 413 overlaps the inductors 35C and 35F in plan view. As a result, the upper side of the inductors 35A, 35B, 35C, 35E, and 35F are shielded from above by at least one of the wires 410 to 413. Furthermore, the sides of the inductors 35A, 35B, 35C, 35E, and 35F can be shielded by at least one of the wires 410 to 413. For example, as illustrated in FIG. 6, the wires 410 and 411 are located on both sides of the inductors 35A and 35B in the longitudinal direction 2. Note that, in FIG. 6, only the wire 410 is illustrated. In this case, both sides of the inductors 35A and 35B in the longitudinal direction 2 are shielded by the wires 410 and 411.

According to the fifth embodiment, since the electronic component 37 is supported by the integrated circuit 31A, the wires 410 to 413 extending from the electronic component 37 can be positioned at a high position. This can reduce the possibility that the wires 410 to 413 come into contact with the inductors 35A, 35B, 35C, 35E, and 35F.

In the fifth embodiment, the number of wires 40 extending from the terminals 37a of the electronic component 37 mounted on the substrate 20 by wire bonding is three (wires 409), and the number of wires 40 extending from the terminals 37b is four (wires 410 to 413). However, the number of wires 40 extending from the terminal 37a is not limited to three, and the number of wires 40 extending from the terminal 37b is not limited to four.

Sixth Embodiment

Figure 7:
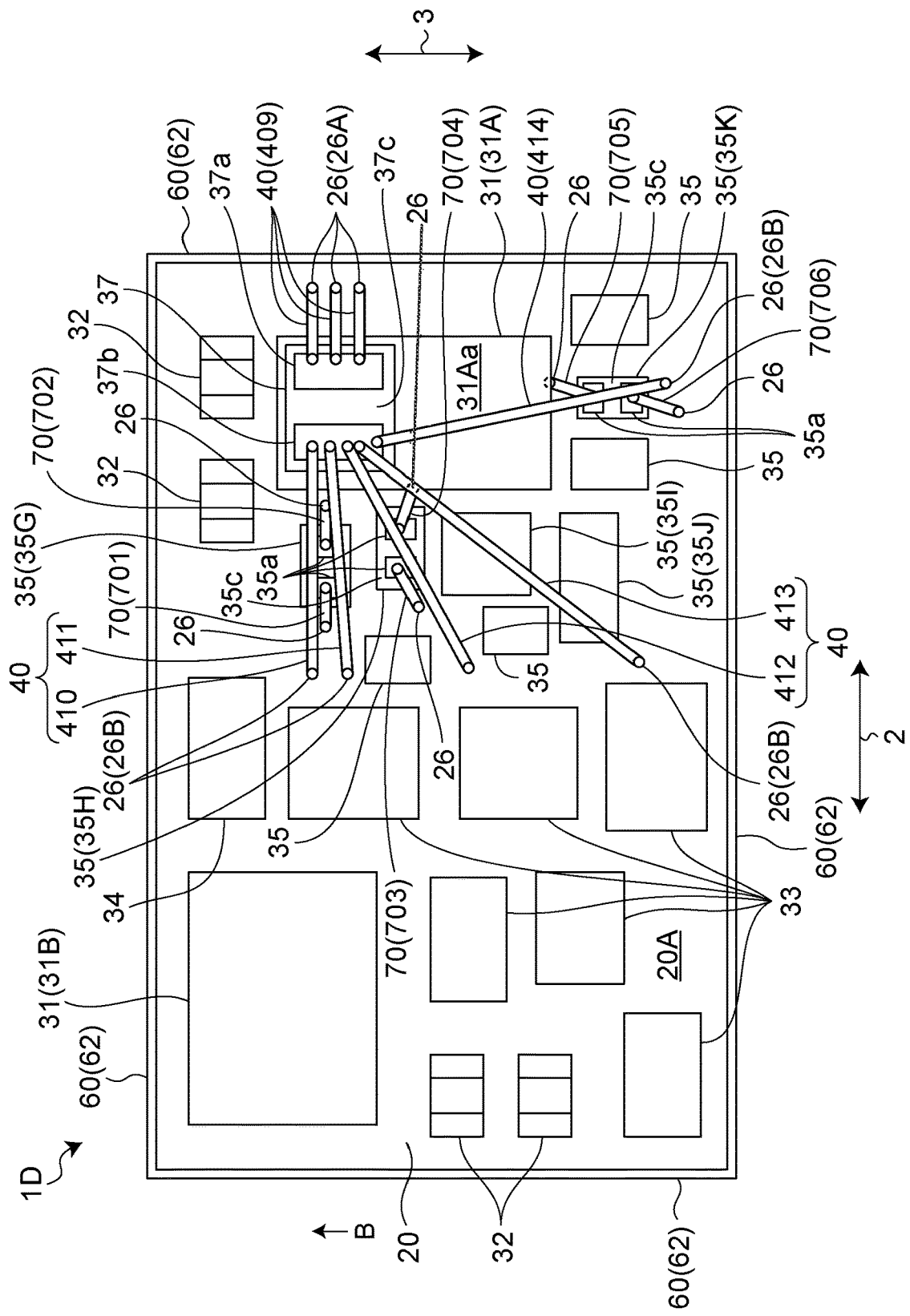
FIG. 7 is a plan view of a circuit module according to a sixth embodiment of the present disclosure.

FIG. 7 is a plan view of a circuit module according to a sixth embodiment of the present disclosure. A circuit module 1D according to the sixth embodiment is different from the circuit module 1C according to the fifth embodiment in two points. The first point is that the shield target components are mounted on a substrate 20 by a mounting method via a wire. The second point is that wires performing shielding and wires connected to the shield target components do not intersect with each other directly above the shield target components.

As illustrated in FIG. 7, the circuit module 1D according to the sixth embodiment includes nine inductors 35. Among the nine inductors 35, five inductors 35G to 35K are shield target components. Among the five inductors 35G to 35K which are components to be shielded, three inductors 35G, 35H, and 35K are mounted on the substrate 20 by wire bonding. On the other hand, the remaining six inductors 35 are mounted on the substrate 20 by a mounting method not via wires.

In the sixth embodiment, the circuit module 1D includes eight wires 40, which is one more than that in the fifth embodiment. The eight wires 40 are the three wires 409 and the four wires 410 to 413 of the fifth embodiment, and an additional wire 414.

Similarly to the wires 410 to 413, the wire 414 connects a terminal 37b to the substrate 20 (specifically, a wiring electrode 26B formed on the substrate 20). That is, the terminal 37b is connected to the ground via the wires 410 to 414. The wires 410 to 414 are an example of the first wires. The terminal 37b is an example of the ground terminal.

One end portions of the wires 410 to 414 are connected to the terminal 37b. Each of the wires 410 to 414 extends from the terminal 37b in a different direction. The other end portions of the wires 410 to 414 are connected to wiring electrodes 26B which are at different positions on a surface 20A of the substrate 20.

The wires 410 to 414 extend from the terminal 37*b* to the wiring electrodes 26B through directly above the shield target components of the electronic components 30. In the sixth embodiment, the shield target components are the five inductors 35G to 35K as described above. The inductors 35G to 35K are an example of the second component.

In plan view, the wires 410 and 411 overlap the inductor 35G. Furthermore, the wire 412 overlaps the inductor 35H in plan view. Furthermore, the wire 413 overlaps the inductors 351 and 35J in plan view. Furthermore, the wire 414 overlaps the inductor 35K in plan view. As a result, the upper side of the inductors 35G to 35K is shielded by at least one of the wires 410 to 414. Note that, although not illustrated, the side of the inductors 35G to 35K can also be shielded by at least one of the wires 410 to 414.

In the sixth embodiment, the circuit module 1D includes six wires 70 (wires 701 to 706) in addition to the wires 40. Note that the number of wires 70 included in the circuit module 1D is not limited to six. The wires 70 are an example of the second wire.

On an upper surface 35*c* of each of the inductors 35G, 35H, and 35K, two terminals 35*a* are formed. Each of the wires 70 electrically connects each of the terminals 35*a* to the substrate 20 (specifically, a wiring electrode 26 formed on the substrate 20). The wiring electrode 26 to which the wire 70 is connected may be a wiring electrode 26A or a wiring electrode 26B.

Each of the wires 70 extends from each of the terminals 35*a*. In other words, one end portion of each wire 70 is connected to each terminal 35*a*. The wires 701 and 702 extend from each terminal 35*a* of the inductor 35G. The wires 703 and 704 extend from each terminal 35*a* of the inductor 35H. The wires 705 and 706 extend from each terminal 35*a* of the inductor 35K. The other end portion of each wire 70 is connected to each wiring electrode 26.

The wires 701 and 702 do not intersect the wires 40 (wires 410 and 411) directly above the inductor 35G. In other words, in plan view, the wires 701 and 702 do not intersect the wires 40 (wires 410 and 411) which are at positions overlapping the inductor 35G.

Furthermore, the wire 703 does not intersect the wire 40 (wire 412) directly above the inductor 35H. In other words, the wire 703 does not intersect the wire 40 (wire 412) which is at a position overlapping the inductor 35H in plan view.

On the other hand, the wire 704 intersects the wire 40 (wire 412) directly above the inductor 35H. Furthermore, the wires 705 and 706 intersect the wires 40 (wires 413 and 414) directly above the inductor 35K.

According to the sixth embodiment, in a case where the wires 70 are connected to the ground, the wires 70 have a function of shielding the inductors 35G to 35K similarly to the wires 410 to 414. According to the sixth embodiment, the wires 410 and 411 covering the inductor 35G and the wires 701 and 702 extending from the inductor 35G do not intersect with each other directly above the inductor 35G. Furthermore, the wire 412 covering the inductor 35H and the wire 703 extending from the inductor 35H do not intersect with each other directly above the inductor 35H. Thus, it is easy to arrange the wires 410 and 414 and the wires 701 and 702 substantially in parallel directly above the inductor 35G, and it is easy to arrange the wire 412 and the wire 703 substantially in parallel directly above the inductor 35H. As a result, since a region close to a surface can be formed by the plurality of wires arranged substantially in parallel, the shielding effect for the inductors 35G and 35H can be enhanced.

In the sixth embodiment, the wires 701 to 703 do not intersect the wires 40 which are at positions overlapping the shield target component in plan view. However, it is not limited to the wires 701 to 703 that do not intersect the wires 40 which are at the positions overlapping with the shield target components in plan view.

Seventh Embodiment

Figure 8:
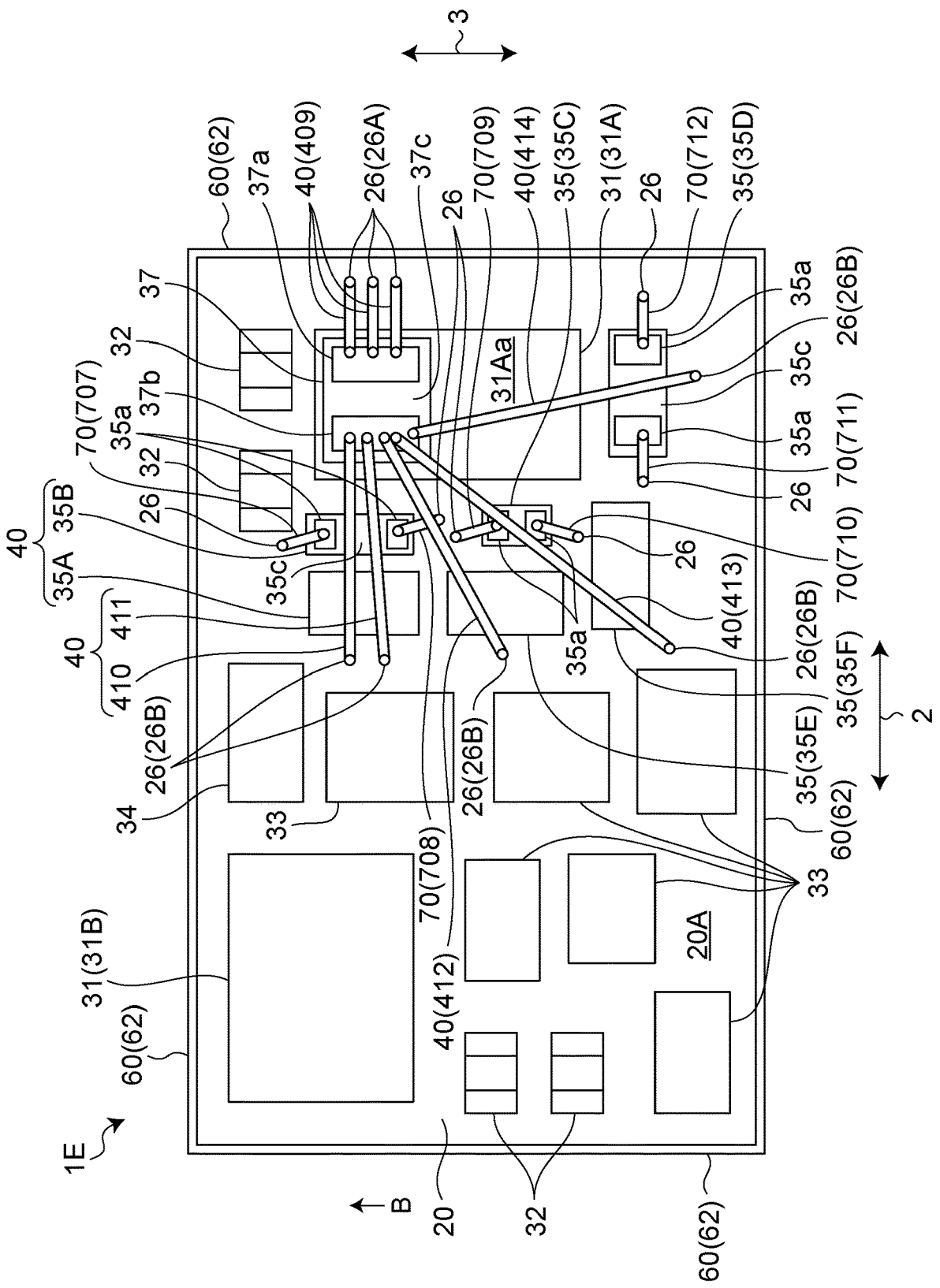
FIG. 8 is a plan view of a circuit module according to a seventh embodiment of the present disclosure.

FIG. 8 is a plan view of a circuit module according to a seventh embodiment of the present disclosure. A circuit module 1E according to the seventh embodiment is different from the circuit module 1C according to the fifth embodiment in two points. The first point is that the shield target components are mounted on a substrate 20 by a mounting method via a wire. The second point is that wires extending from terminals of the shield target components extend away from wires, which are positioned directly above the shield target components and perform shielding on the shield target components, in plan view.

As illustrated in FIG. 8, the circuit module 1E according to the seventh embodiment includes six inductors 35 (inductors 35A to 35F). All of the six inductors 35A to 35F are shield target components. Among the six inductors 35A to 35F which are the shield target components, three inductors 35B, 35C, and 35D are mounted on the substrate 20 by wire bonding. On the other hand, the remaining three inductors 35A, 35E, and 35F are mounted on the substrate 20 by a mounting method not via wires.

In the seventh embodiment, the circuit module 1E includes eight wires 40, which is one more than that in the fifth embodiment. The eight wires 40 are the three wires 409 and the four wires 410 to 413 of the fifth embodiment, and an additional wire 414.

Similarly to the wires 410 to 413, the wire 414 connects a terminal 37*b* to the substrate 20 (specifically, a wiring electrode 26B formed on the substrate 20). That is, the terminal 37*b* is connected to the ground via the wires 410 to 414. The wires 410 to 414 are an example of the first wires. The terminal 37*b* is an example of the ground terminal.

One end portions of the wires 410 to 414 are connected to the terminal 37*b*. Each of the wires 410 to 414 extends from the terminal 37*b* in a different direction. The other end portions of the wires 410 to 414 are connected to wiring electrodes 26B which are at different positions on a surface 20A of the substrate 20.

The wires 410 to 414 extend from the terminal 37*b* to the wiring electrodes 26B through directly above the shield target components of the electronic components 30. In the seventh embodiment, as described above, the shield target components are the six inductors 35A to 35F. The inductors 35A to 35F are an example of the second component.

In plan view, the wires 410 and 411 overlaps the inductors 35A and 35B. Furthermore, the wire 412 overlaps the inductor 35E in plan view. Furthermore, the wire 413 overlaps the inductors 35C and 35F in plan view. Furthermore, the wire 414 overlaps the inductor 35D in plan view. As a result, the upper side of the inductors 35A to 35F is shielded by at least one of the wires 410 to 414. Note that, although not illustrated, the sides of the inductors 35A to 35F can also be shielded by at least one of the wires 410 to 414.

In the seventh embodiment, the circuit module 1E includes six wires 70 (wires 707 to 712) in addition to the wires 40. Note that the number of wires 70 included in the circuit module 1E is not limited to six. The wires 70 are an example of the second wire.

On an upper surface 35*c* of each of the inductors 35B, 35C, and 35D, two terminals 35*a* are formed. Each of the wires 70 electrically connects each of the terminals 35*a* to the substrate 20 (specifically, a wiring electrode 26 formed on the substrate 20). The wiring electrode 26 to which the wire 70 is connected may be a wiring electrode 26A or a wiring electrode 26B.

Each of the wires 70 extends from each of the terminals 35*a*. In other words, one end portion of each wire 70 is connected to each terminal 35*a*. Wires 707 and 708 extend from each terminal 35*a* of the inductor 35B. Wires 709 and 710 extend from each terminal 35*a* of the inductor 35C. Wires 711 and 712 extend from each terminal 35*a* of the inductor 35D. The other end portion of each wire 70 is connected to each wiring electrode 26.

Each of the wires 707 and 708 extends from the terminal 35*a* of the inductor 35B so as to be separated from portions of the wires 410 and 411 which are at positions overlapping the inductor 35B in plan view.

Each of the wires 709 and 710 extends from the terminal 35*a* of the inductor 35C so as to be separated from a portion of the wire 413 which is at a position overlapping with the inductor 35C in plan view.

Each of the wires 711 and 712 extends from the terminal 35*a* of the inductor 35D so as to be separated from a portion of the wire 414 which is at a position overlapping the inductor 35D in plan view.

According to the seventh embodiment, in a step of connecting the wires 40 to the electronic component 37 or the substrate 20, the connection can be less likely to be blocked by the wires 70 extending from the inductors 35A to 35F. Furthermore, in a step of connecting the wires 70 to the inductors 35A to 35F and the substrate 20, it is possible to reduce the possibility of the connection to be blocked by the wires 40 extending from the electronic component 37.

In the seventh embodiment, it has been described that all of the six wires 707 to 712 extend away from the wires, which are located directly above the shield target components and perform shielding on the shield target components, but some of the six wires 707 to 712 may extend away from the wires.

Note that, by appropriately combining arbitrary embodiments among the various embodiments described above, the effects of the respective embodiments can be achieved. For example, the configurations of the sixth embodiment and the seventh embodiment may be applied to the first embodiment.

Although the present disclosure has been fully described in connection with the preferred embodiments thereof with reference to the drawings as appropriate, it is to be noted that various changes and modifications are apparent to those skilled in the art. Such changes and modifications are to be understood as included within the scope of the present disclosure as defined by the appended claims unless they depart therefrom.

1 circuit module
20 substrate
31A electronic component (support component)
35A inductor (first component)
35*a* terminal
35*c* upper surface
35Ab terminal
35Ac upper surface
35B inductor (second component)
35C inductor (second component)
35D inductor (second component)
36 filter component (third component)

40 wire
402 wire (first wire)
403 wire (first wire)
404 wire (first wire)
405 wire (first wire)
406 wire (first wire)
70 wire (second wire)

What is claimed is:

1. A circuit module comprising:
a substrate;
at least one first component mounted on the substrate and each including a ground terminal on an upper surface;
a plurality of first wires; and
a second component mounted on the substrate and overlapping at least one of the plurality of first wires in plan view, and wherein
each of the plurality of first wires connects the ground terminal of the first component to the substrate.

2. The circuit module of claim 1, wherein
the ground terminal of the first component to which each of the plurality of first wires is connected is one ground terminal provided on the upper surface of the first component.

3. The circuit module of claim 2, wherein
the at least one first component comprises a plurality of first components, and
each of the ground terminals of the plurality of first components is connected to at least one of the first wires.

4. The circuit module of claim 2, wherein
the first component is an inductor.

5. The circuit module of claim 2, wherein
the second component is an element constituting a matching circuit.

6. The circuit module of claim 2, further comprising:
a third component mounted on the substrate and including a ground terminal on an upper surface, and wherein
each of the plurality of first wires connects the ground terminal of the first component to the ground terminal of the third component, and wherein
the ground terminal of the third component is connected to the substrate.

7. The circuit module of claim 2, wherein
the ground terminal of the first component is electrically connected to an electrode disposed on the substrate via a through hole penetrating the first component.

8. The circuit module of claim 2, further comprising:
a support component mounted on the substrate and supporting the first component, and wherein
the first component is mounted on the substrate via the support component by being supported by the support component.

9. The circuit module of claim 2, further comprising:
a second wire connecting the second component to the substrate, wherein
the second component includes a terminal to which the second wire is connected on an upper surface, and wherein
the second wire does not intersect some of the first wires being at positions overlapping the second component in plan view.

10. The circuit module of claim 2, further comprising:
a second wire connecting the second component to the substrate, wherein
the second component includes a terminal to which the second wire is connected on an upper surface, and wherein the second wire extends from the terminal so as to be separated from some of the first wires being at positions overlapping the second component in plan view.

11. The circuit module of claim 1, wherein the at least one first component comprises a plurality of first components, and each of the ground terminals of the plurality of first components is connected to at least one of the first wires.

12. The circuit module of claim 11, wherein the first wires connected to different ones of the plurality of first components intersect with each other in plan view.

13. The circuit module of claim 1, wherein the first component is an inductor.

14. The circuit module of claim 1, wherein the second component is an element constituting a matching circuit.

15. The circuit module of claim 1, further comprising:

a third component mounted on the substrate and including a ground terminal on an upper surface, and wherein each of the plurality of first wires connects the ground terminal of the first component to the ground terminal of the third component, and wherein the ground terminal of the third component is connected to the substrate.

16. The circuit module of claim 1, wherein the ground terminal of the first component is electrically connected to an electrode disposed on the substrate via a through hole penetrating the first component.

17. The circuit module of claim 1, further comprising:

a support component mounted on the substrate and supporting the first component, and wherein the first component is mounted on the substrate via the support component by being supported by the support component.

18. The circuit module of claim 1, further comprising:

a second wire connecting the second component to the substrate, wherein the second component includes a terminal to which the second wire is connected on an upper surface, and wherein the second wire does not intersect some of the first wires being at positions overlapping the second component in plan view.

19. The circuit module of claim 1, further comprising:

a second wire connecting the second component to the substrate, wherein the second component includes a terminal to which the second wire is connected on an upper surface, and wherein the second wire extends from the terminal so as to be separated from some of the first wires being at positions overlapping the second component in plan view.

20. The circuit module of claim 1, wherein in a direction orthogonal to a mounting surface of the substrate on which the first component and the second component are mounted, the ground terminal of the first component is farther from the mounting surface than the second component.

* * * * *